(12) United States Patent
Chen et al.

(10) Patent No.: US 11,776,611 B2
(45) Date of Patent: Oct. 3, 2023

(54) MANAGING WRITE DISTURB FOR UNITS OF A MEMORY DEVICE USING WEIGHTED WRITE DISTURB COUNTS

(71) Applicant: MICRON TECHNOLOGY, INC., Boise, ID (US)

(72) Inventors: Mikai Chen, Sunnyvale, CA (US); Zhenming Zhou, San Jose, CA (US); Murong Lang, San Jose, CA (US); Zhenlei Shen, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/393,013

(22) Filed: Aug. 3, 2021

(65) Prior Publication Data
US 2023/0043238 A1 Feb. 9, 2023

(51) Int. Cl.
*G11C 11/406* (2006.01)
*G11C 11/4078* (2006.01)
*G11C 11/4096* (2006.01)

(52) U.S. Cl.
CPC .... *G11C 11/40622* (2013.01); *G11C 11/4078* (2013.01); *G11C 11/4096* (2013.01); *G11C 11/40615* (2013.01)

(58) Field of Classification Search
CPC ............ G11C 11/40622; G11C 11/406
USPC ....................................................... 365/222
See application file for complete search history.

(56) References Cited

U.S. PATENT DOCUMENTS

| | | | |
|---|---|---|---|
| 9,711,234 B1* | 7/2017 | Van Gaasbeck ... | G11C 16/3418 |
| 10,049,755 B2* | 8/2018 | Lee .......................... | G11C 7/04 |
| 10,381,073 B1* | 8/2019 | Bradshaw .......... | G11C 13/0069 |
| 10,566,048 B2* | 2/2020 | Qin ....................... | G11C 11/419 |
| 10,672,486 B2* | 6/2020 | Zhu ..................... | G11C 16/3431 |
| 10,747,448 B2* | 8/2020 | Kwon .................. | G06F 3/0679 |
| 11,133,061 B2* | 9/2021 | McGlaughlin ..... | G11C 13/0033 |
| 11,210,027 B2* | 12/2021 | Parker .................. | G06F 3/0659 |
| 2012/0166707 A1* | 6/2012 | Franca-Neto .......... | G11C 29/50 711/E12.008 |
| 2013/0176778 A1 | 7/2013 | Chen | |
| 2014/0146609 A1 | 5/2014 | Avila | |
| 2020/0066342 A1 | 2/2020 | Ha | |

OTHER PUBLICATIONS

PCT Notification of Transmittal of the International Search Report and the Written Opinion of the International Searching Authority for PCT Application No. PCT/US2022/039206, dated Nov. 3, 2022, 9 pages.

* cited by examiner

*Primary Examiner* — Muna A Techane
(74) *Attorney, Agent, or Firm* — Lowenstein Sandler LLP (57) ABSTRACT

A processing device of a memory sub-system is configured to determine, for a memory unit of the memory device, a plurality of write disturb counts associated with the memory unit, wherein each of the plurality of write disturb (WD) count is associated with a corresponding write disturb direction; compute, for the memory unit, a weighted WD count reflecting the plurality of write disturb counts; determine whether the weighted WD count meets a criterion; and responsive to determining that the weighted WD count meets the criterion, perform a refresh operation on the memory unit.

18 Claims, 6 Drawing Sheets

┌─────────────────────────────────────────────────────────────┐
│  DETECT A WRITE OPERATION PERFORMED ON A FIRST UNIT OF THE  │
│  MEMORY DEVICE, THE FIRST UNIT ADJACENT TO A SECOND UNIT    │
│  OF THE MEMORY DEVICE FROM A FIRST DIRECTION 510            │
└─────────────────────────────────────────────────────────────┘
                              │
                              ▼
┌─────────────────────────────────────────────────────────────┐
│  DETERMINE, FROM A PLURALITY OF WRITE DISTURB (WD) COUNTS   │
│  OF THE SECOND UNIT, A WD COUNT THAT IS ASSOCIATED WITH     │
│  THE FIRST DIRECTION 520                                    │
└─────────────────────────────────────────────────────────────┘
                              │
                              ▼
┌─────────────────────────────────────────────────────────────┐
│  INCREMENT THE WD COUNT OF THE SECOND UNIT THAT IS          │
│  ASSOCIATED WITH THE FIRST DIRECTION 530                    │
└─────────────────────────────────────────────────────────────┘
                              │
                              ▼
┌─────────────────────────────────────────────────────────────┐
│  COMPUTE, FOR THE SECOND UNIT, A WEIGHTED WRITE DISTURB     │
│  COUNT REFLECTING THE PLURALITY OF WD COUNTS 540            │
└─────────────────────────────────────────────────────────────┘
                              │
                              ▼
┌─────────────────────────────────────────────────────────────┐
│  DETERMINE WHETHER THE WEIGHTED WRITE DISTURB COUNT         │
│  EXCEEDS A THRESHOLD 550                                    │
└─────────────────────────────────────────────────────────────┘
                              │
                              ▼
┌─────────────────────────────────────────────────────────────┐
│  RESPONSIVE TO DETERMINING THAT THE WEIGHTED WRITE DISTURB  │
│  COUNT EXCEEDS THE THRESHOLD, PERFORM A REFRESH OPERATION   │
│  ON DATA STORED AT THE SECOND UNIT 560                      │
└─────────────────────────────────────────────────────────────┘
```

MANAGING WRITE DISTURB FOR UNITS OF A MEMORY DEVICE USING WEIGHTED WRITE DISTURB COUNTS

TECHNICAL FIELD

Embodiments of the disclosure relate generally to memory sub-systems, and more specifically, relate to managing write disturb for units of a memory device using weighted write disturb count.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to managing write disturb for units of a memory device using weighted write disturb count. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by not-and (NAND) type flash memory devices. Other examples of non-volatile memory devices are described below in conjunction with FIG. 1. A non-volatile memory device is a package of one or more dice. Each die can consist of one or more planes. Planes can be grouped into logic units (LUN). The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a not-and (NAND) memory device. For some types of non-volatile memory devices (e.g., NAND devices), each plane consists of a set of physical blocks. A "block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information.

Each of the memory devices can include one or more units of memory. Each memory unit can include one or more memory cells (e.g., a page, a block, or some other translation unit (TU)). Depending on the cell type, a cell can store one or more bits of binary information, and has various logic states that correlate to the number of bits being stored. The logic states can be represented by binary values, such as "0" and "1, or combinations of such values. For example, a single level cell "(SLC) can store one bit of information and has two logic states.

When data is conventionally written to a memory unit of the memory device for storage, adjacent (e.g., contiguous, neighboring, nearby, next to, etc.) memory units can experience what is known as "write disturb." Write disturb is the result of continually writing data to a particular memory unit without writing and/or refreshing data stored at nearby memory units, causing the nearby memory units to change state over time (e.g., the programmed state changes). If too many write operations are performed on the particular memory unit (also referred to as the "aggressor" hereinafter), data stored at adjacent or proximate memory units (also referred to as the "victim" hereinafter) of the memory device can become corrupted or incorrectly stored. The heat generated from the aggressor unit during the write operations can cause the memory alloy of the victim unit to crystalize, degrading its quality. Thus, in traditional memory sub-systems, a higher error rate can result when reading the data stored at the adjacent or proximate memory units. The higher error rate (e.g., raw bit error rate, or RBER) can increase the use of an error detection and correction operation (e.g., an error control operation) for subsequent operations (e.g., read and/or write) performed on the memory unit. The increased use of the error control operation can result in a reduction of the performance of the conventional memory sub-system. As more resources of the memory sub-system are used to perform the error control operation, fewer resources can be used to perform other read operations or write operations. Thus, the performance of the memory sub-system can be decreased as fewer read operations and write operations can be performed within a particular amount of time.

To mitigate the effects of write disturb on data stored at the memory sub-system, conventional memory sub-systems typically utilize various write refresh processes. For example, conventional memory sub-systems can perform a write refresh based on a number of write operations performed on a memory unit. Typically, the memory sub-system stores the number of write operations performed on units of the memory device as metadata on the memory device. The number of write operations performed on a unit can be read from the metadata stored at the memory device and used to determine a disturb count for one or more of the portions (e.g., proximate memory units) of the memory device. The disturb count can correspond to a number of write operations performed on a particular unit without an intervening write or refresh operation for the particular unit. Once the disturb count exceeds a threshold number of write operations, the data of the unit of the memory device can be refreshed. However, due to intrinsic product design and thermal transfer mechanism, the write disturb (WD) effect can be different based on the direction from which the WD effect arrives at a given memory unit. As an example, a victim unit can safely tolerate different count of write disturb aggressions in one direction but can have a more serious damage from an equal number of write disturb aggressions in another direction. Additionally, the WD effect can also exhibit variations based on the layer of memory units where the memory unit is located. Accordingly, a write disturb mitigation mechanism that takes into account the location of the memory unit as well as the direction of the write disturb can be desired.

Aspects of the present disclosure address the above and other deficiencies by providing a memory sub-system that dynamically calculates the refresh rate of a unit of memory using a weighted write disturb count that is based on the location of the memory unit within the memory device and the direction in which the write disturb was imposed on the unit. In certain embodiments, a unit of memory can be one memory cell or a group of adjacent memory cells within the memory device. In an embodiment, write disturb (WD) aggressions coming from various directions to a memory unit can be counted and stored separately. For example, a WD aggression coming to a given unit from a horizontal direction can be counted and stored as WD1 and WD aggression coming to the unit from a vertical direction can be counted and stored as WD2. In one embodiment, when the memory sub-system detects that a write operation is performed on a memory unit that is adjacent to the given memory unit from a certain direction, the memory subs-system can determine that a write disturb has occurred to the given memory unit from the certain direction. The memory sub-system can then obtain a WB count corresponding to the certain direction, increment the WD count of the certain direction, and then store the incremented WD count. The memory sub-system can repeat the process of incrementing each WD count each time a write disturb of the memory unit occurs, according to the direction of the write disturb. The memory sub-system can then calculate a weighted WD count for each unit of memory, such that a WD count of one direction can have a certain weight that is larger or smaller than the weight of a WD count of another direction.

In an embodiment, the weighted WD count of a unit of memory can also depend on the location of the unit within the memory device. As an example, the location of the unit of memory can reflect the layer of memory cells within the memory device. A layer can be a deck of memory cells within a set of decks of the memory device, a plane within the memory device, or any other group of memory cells within the memory device. In an embodiment, each layer of memory units can have a corresponding set of weight coefficients for calculating the weighted WD count of a given unit of memory, such that each weight coefficient corresponds to a WD direction. In this case, when calculating the weighted WD count for a given unit of memory, the memory sub-system can retrieve a count of WD of a given direction and multiply that WD count by the corresponding weight coefficient of the given direction that is associated with the layer where the unit is located. The result is a weighted WD at the given direction. The memory sub-system can then repeat the process of calculating a weighted WD for each direction. When the weighted WD for each direction is calculated, the memory sub-system can add the weighted WD of all directions in order to determine the weighted WD count of the unit of memory.

In some embodiments, when the weighted WD count of the memory unit is calculated, the memory sub-system can compare the weighted WD count to a certain threshold, in order to determine whether to refresh data stored at the memory unit. Refreshing the data stored at the memory unit may include reading the data stored at the memory unit and then writing the same data back to the memory unit, thus resetting the threshold voltage of the memory cells of the memory unit and significantly reducing the write disturb effect, as explained in more details herein below. In an embodiment, if the memory sub-system can determines that the weighted WD count of the memory unit exceeds the threshold, the memory sub-system can perform a refresh operation on data of the memory unit. In certain embodiments, the memory sub-system can perform the process of calculating the weighted WD count for each memory unit and performing refresh operations on memory units, pursuant to the threshold count, periodically, thus minimizing the write disturb effect on the memory units of the memory sub-system. In one embodiment, the memory sub-system can assign a separate threshold count to each layer of the set of layers of the memory sub-system, such that the frequency of performing the refresh operation can vary from one layer to another depending on the value of the threshold count. Having a variable frequency of performing refresh operations on memory units based on the layer can enable the memory sub-system to further tune the data refresh based on the characteristics of each layer. In an illustrative example, the memory sub-system can assign a certain threshold count to one layer of a memory device of the memory sub-system, and can assign another threshold count for another layer of the memory device. In this case, data stored at a memory unit located in the first layer will be refreshed when the weighted WD count of the memory unit reaches the first threshold count, while data stored at a second memory unit located in the other layer will be refreshed when the weighted WD count of the second memory unit reaches the other threshold count. In one embodiment, the threshold count for each layer of the memory devices within the memory sub-system can be determined and assigned during the product development stage of the memory sub-system based on the desired distribution of refresh rates over the memory device that would minimize the overall memory degradation and enable a more efficient refresh rate of units of the memory device.

Advantages of the present disclosure include, but are not limited to, mitigating write disturb effects on units of a memory device of a memory sub-system based on the location of the memory unit and the direction where the write disturb is received at the memory unit. Because the memory sub-system include factors that impact the extent of the write disturb effect on a memory unit (e.g., write disturb direction and memory unit location) to determine when to perform a refresh operation, reliability of data stored at the memory units can be significantly enhanced. Additionally, by avoiding a fixed frequency of performing the refresh operation on memory units, the memory sub-system can minimize potential performance degradation of the memory device that may be caused be unnecessarily performing refresh operations regardless of relevant factors like the disturb direction and the location of the memory unit.

Figure 1:
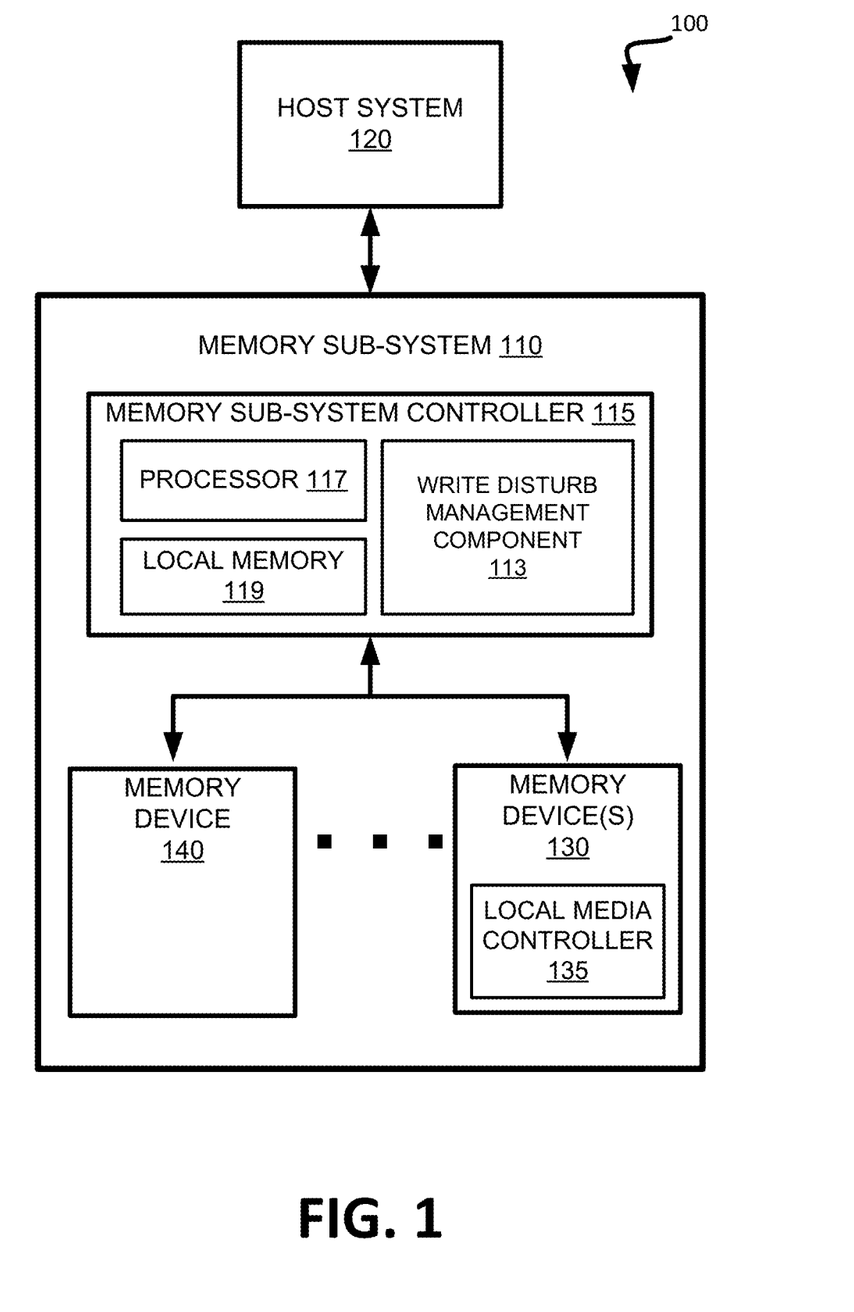
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components, such as memory devices 130, when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory devices such as 3D cross-point type and NAND type memory are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), not-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes write disturb management component 113 that dynamically calculates a refresh rate of a unit of a memory device 130-140 of the memory sub-system 110 using a weighted write disturb count. The weighted write disturb count can be calculated based on the location of the memory unit within memory device 130-140 and the direction in which the write disturb was imposed on the memory unit. In an implementation, in order to calculate the weighted write disturb count for a memory unit, write disturb management component 113 can retrieve, from a metadata storage area of the memory sub-system 110, a set of write disturb counts for the memory unit. In one implementation, the write disturb management component 113 can store a separate weighted write disturb count for each direction from which a write disturb is originated. As an example, a write disturb affecting a given memory unit due to a write operation that has been performed on another memory unit that is horizontally adjacent to the given memory unit can be counted as a first write disturb count. On the other hand, a write disturb affecting the memory unit due to a write operation that has been performed on a third memory unit that is vertically adjacent to the memory unit ca be counted as a second write disturb count.

Upon receiving the set of write disturb counts of the memory unit, write disturb management component 113 can compute a weighted write disturb count for the memory unit using the set of write disturb counts and a location coefficient corresponding to each write disturb count. In an implementation, the location coefficient for a given write disturb count can be assigned a certain weight for the write disturb count that is based on the layer of memory device 130-140 where the memory unit is located. As an example, a memory unit located at layer A of memory device 130-140 can have a location coefficient for the horizontal direction that can be different than another location coefficient for another memory unit located at layer B of memory device 130-140. In certain implementations, a layer of memory units can refer to a deck of memory units within certain types of memory devices 130-140 (e.g., 3D cross-point memory devices).

In an implementation, in order to manage a write disturb count of a certain direction of given memory unit, write disturb management component 113 can monitor write operations that are performed on memory units adjacent to the given memory unit. As an example, when write disturb management component 113 detects that a write operation is performed on a unit of memory that is adjacent to the given memory unit from the certain direction, write disturb management component 113 can assume that a write disturb had occurred to the given memory unit from the certain direction. Write disturb management component 113 can then select the write disturb count of the given memory unit that corresponds to the certain direction, and can increment the selected write disturb count that associated with the certain direction. Write disturb management component 113 can store the incremented write disturb count of the memory unit, so that it can be used when calculating the weighted write disturb count of the memory unit.

In certain implementations, write disturb management component 113 can receive a request to determine whether to perform a refresh operation on data stored at a memory unit. As an example, the request can be originated from a process executing periodically on a background thread for evaluating whether a refresh operation needs to be performed. Write disturb management component 113 then can compute a weighted write disturb (WD) count for the memory unit and can determine to perform the refresh operation of the memory unit if the weighted WD count meets a criterion (e.g., by determining whether the weighted WD count exceeds a certain threshold count). In order to calculate the weighted WD count, write disturb management component 113 can identify a layer, from a set of layers of memory device 130-140, where the memory unit is located. Write disturb management component 113 can then retrieve the WD counts associated with the memory unit, where each WD count corresponds to a WD direction. Write disturb management component 113 can determine a location coefficient associated with each WD count. In an implementation, a location coefficient associated with a given WD direction can vary based on the layer of the memory device 130-140 where the memory unit is located. Write disturb management component 113 can then multiply each WD count by its corresponding location coefficient that is associated with the layer where the memory unit is located, to obtain weighted WD count for each direction. The sum of the weighted WD counts of all directions represents the weighted WD count of the memory unit.

In some implementations, subsequent to calculating the weighted WD count of the memory unit, write disturb management component 113 can compare the weighted WD count with a predetermined threshold count, in order to determine whether a refresh operation of the memory unit can be performed. If the weighted WD count exceeds the threshold count, write disturb management component 113 can perform a refresh operation of data stored at the memory unit (e.g., by reading the data stored at the memory unit and then writing the data back to the memory unit). After performing the data refresh operation on the memory unit, write disturb management component 113 can reset the value of each WD count of the memory unit to zero, so that each count can reflect new write disturb occurrences after the refresh operation is performed. On the other hand, if the weighted WD count does not exceed the threshold count, write disturb management component 113 can continue to monitor WD occurrences and continue to increment corresponding WD counts without performing a data refresh operation. In some implementations, the threshold count that determines the criteria for performing the refresh operation on a memory unit can be dependent on the layer where the memory unit is located.

Figure 2A:
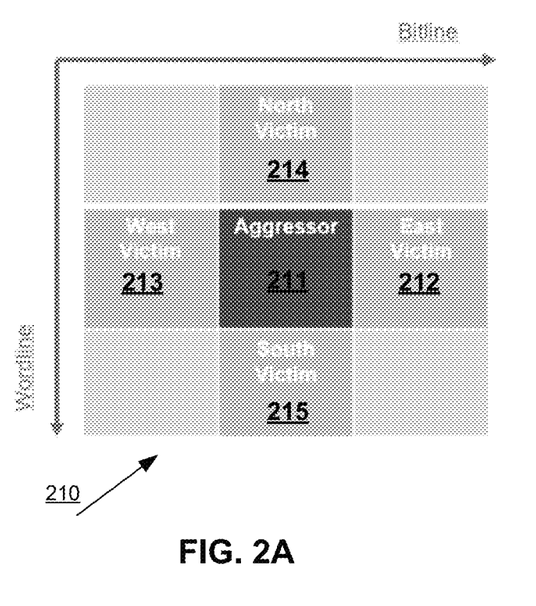
FIG. 2A illustrates an example memory unit causing a write disturb effect on adjacent memory units within a layer of memory units of a memory device, in accordance with embodiments of the disclosure.

FIG. 2A illustrates an example memory unit causing a write disturb effect on adjacent memory units within a layer of memory units of a memory device, in accordance with embodiments of the disclosure. In one implementation, layer 210 can include a set of memory units 211-215, such that memory unit 211 is adjacent to memory unit 214 and memory unit 215 vertically. Memory unit 211 is also adjacent to memory unit 212 and memory unit 213 horizontally. In one implementation, layer 210 can include a shared bitline having a number of pillars extending to a separate source line. Each pillar can be a vertical conductive trace and the intersections of each pillar and each wordline forms a memory unit (e.g., a memory cell). In this case, each memory unit has four adjacent neighboring memory units abutting its bitline-wordline intersection from the north, east, south, west directions.

In some implementations, when a write operation is performed to memory unit 211, the voltage state of each neighboring memory unit is altered, thus eventually resulting in a degree of distortion of data of the neighboring memory units. In this case, memory unit 211 can be referred to as an aggressor, and its neighboring memory units 212-215 are referred to as victims. In certain implementations, victim memory units 212-215 can tolerate a certain amount of accumulated distortion before their stored data can be reliably detected. Accordingly, a data refresh operation may be performed on each victim memory unit 212-215 where data stored at each memory unit 212-215 is read then written back to the same memory unit 212-215, thus overcoming the effect of the write disturb caused by the aggressor memory unit 211.

Figure 2B:
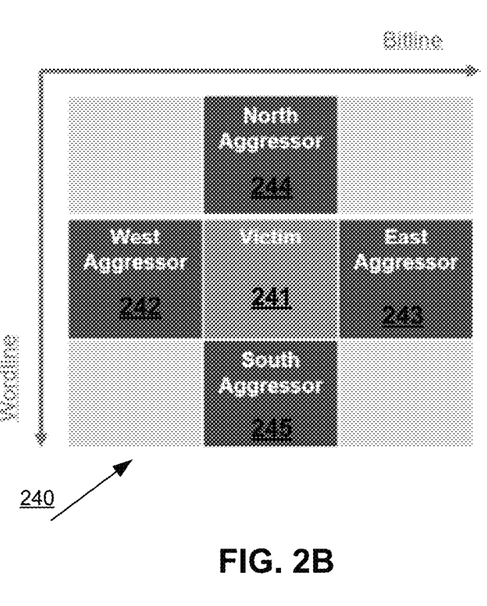
FIG. 2B illustrates an example memory unit receiving write disturb effects from adjacent memory units within a layer of memory units of a memory device, in accordance with embodiments of the disclosure.

FIG. 2B illustrates an example memory unit receiving write disturb effects from adjacent memory units within a layer of memory units of a memory device, in accordance with embodiments of the disclosure. In one implementation, layer 240 can include a set of memory units 241-245, such that memory unit 241 is adjacent to memory unit 244 and memory unit 245 vertically. Memory unit 241 is also adjacent to memory unit 242 and memory unit 243 horizontally. In one implementation, layer 240 can include a shared bitline having a number of pillars extending to a separate source line. Each pillar can be a vertical conductive trace and the intersections of each pillar and each wordline forms a memory unit (e.g., a memory cell). In this case, each memory unit has four adjacent neighboring memory units abutting its bitline-wordline intersection from the north, east, south, west directions.

In some implementations, when a write operation is performed to memory unit 242, a write disturb effect can be received at memory unit 241, as a result of the write operation at memory unit 242. In this case, the write disturb effect is received at memory unit 241 from a horizontal direction. A write disturb (WD) count of a horizontal direction that is associated with memory unit 241 can be incremented to reflect the WD effect received from memory unit 242. Similarly, when a write operation is performed to memory unit 243, a write disturb effect from a horizontal direction can be received at memory unit 241, as a result of the write operation at memory unit 243. The write disturb (WD) count of the horizontal direction that is associated with memory unit 241 can be incremented to reflect the WD effect received from memory unit 243.

When a write operation is performed to memory unit 244, a write disturb effect can be received at memory unit 241, as a result of the write operation at memory unit 244. In this case, the write disturb effect is received at memory unit 241 from a vertical direction. A write disturb (WD) count of a vertical direction that is associated with memory unit 241 can be incremented to reflect the WD effect received from memory unit 244. Similarly, when a write operation is performed to memory unit 245, a write disturb effect from a vertical direction can be received at memory unit 241, as a result of the write operation at memory unit 245. The write disturb (WD) count of the vertical direction that is associated with memory unit 241 can be incremented to reflect the WD effect received from memory unit 245.

Figure 3:
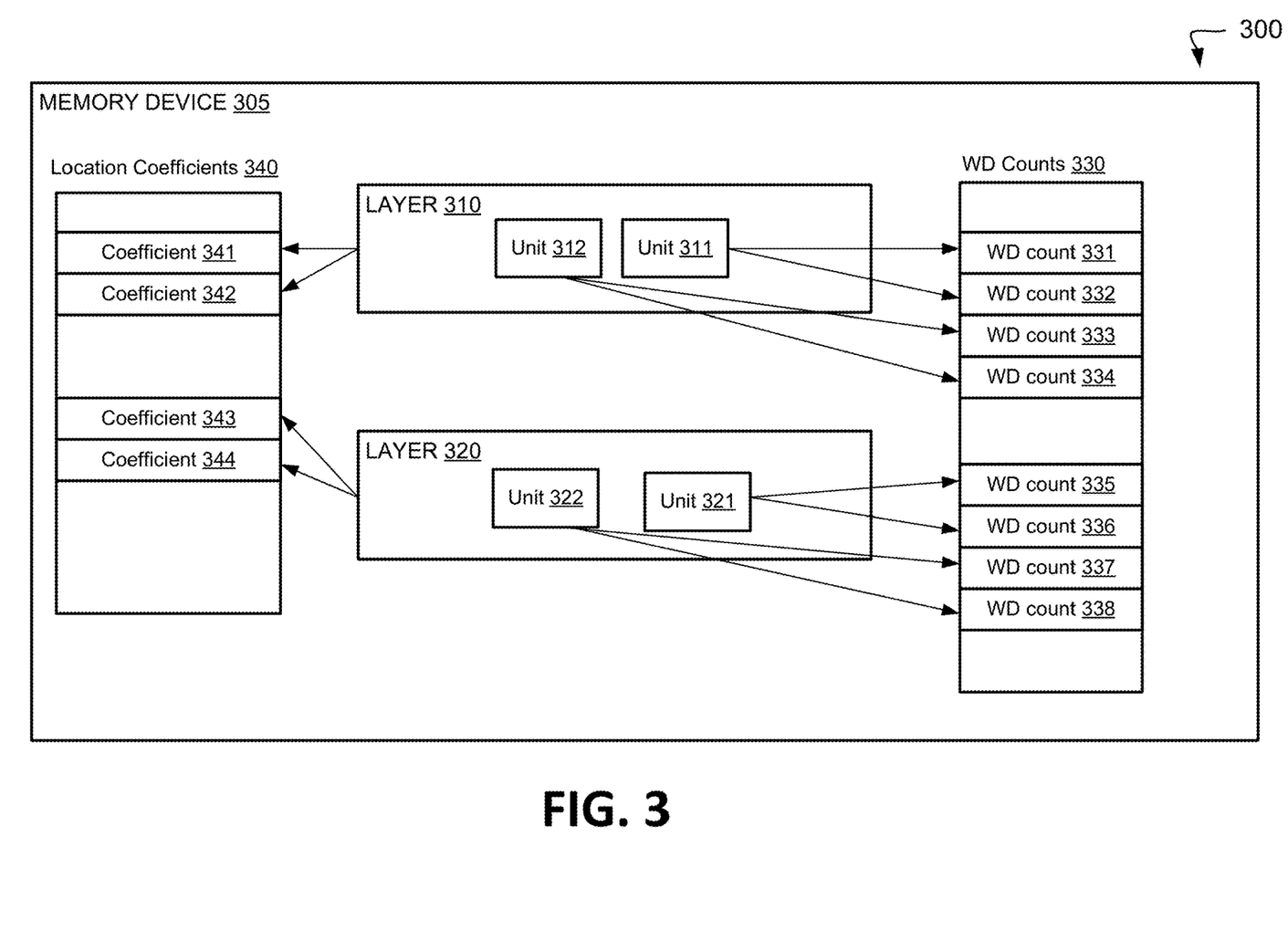
FIG. 3 illustrates an example method of refreshing data of memory units located at layers of a memory device based on a set of write disturb (WD) counts of each unit and location coefficients associated with each layer of the memory device, in accordance with embodiments of the disclosure.

FIG. 3 illustrates an example method 300 of refreshing data of memory units located at layers of a memory device based on a set of write disturb (WD) counts of each unit and location coefficients associated with each layer of the memory device, in accordance with embodiments of the disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In an implementation, memory device 305 can have two layers 310, 320 where each layer can have a set of adjacent memory units. In this case, layer 310 can include memory unit 311 and memory unit 312, and layer 320 can include memory unit 321 and memory unit 322. In an implementation, memory device 305 can be the same or similar to memory device 130 of FIG. 1. In some implementations, a processing logic performing method 300 can maintain a set of write disturb (WD) counts 330 and a set of location coefficients 340, in order to calculate a weighted WD count for each unit 311, 312, 321, and 322. As an example, WD counts 330 and location coefficients 340 can be stored in metadata tables of memory device 305.

In some implementations, the processing logic can maintain a WD count for tracking write disturbs originating from a horizontal direction and a second WD count for tracking write disturbs originating from a vertical direction, for each memory unit of memory device 305. Accordingly, memory unit 311 can have WD count 331 that can be incremented each time memory unit 311 is affected by a write disturb from a horizontal direction (e.g., a WD received from another memory unit that is adjacent to memory unit 311 from the east, or a WD received from another memory unit that is adjacent to memory unit 311 from the west). Further, memory unit 311 can have WD count 332 that can be incremented each time memory unit 311 is affected by a write disturb from a vertical direction (e.g., a WD received from another memory unit that is adjacent to memory unit 311 from the north, or a WD received from another memory unit that is adjacent to memory unit 311 from the south). Similarly, memory unit 312 can have WD count 333 for tracking write disturb occurrences arriving at memory unit 312 from another memory unit to the east of memory unit 312 and write disturb occurrences arriving at memory unit 312 from another memory unit to the west of memory unit 312 (e.g., disturbs coming from a horizontal direction). Memory unit 312 can also have WD count 334 for tracking write disturb occurrences arriving at memory unit 312 from another memory unit to the north of memory unit 312 and write disturb occurrences arriving at memory unit 312 from another memory unit to the south of memory unit 312 (e.g., disturbs coming from a vertical direction).

With respect to layer 320, memory unit 321 of layer 320 can have WD count 335 that can be incremented each time memory unit 321 is affected by a write disturb from a horizontal direction (e.g., a WD received from another memory unit that is adjacent to memory unit 321 from the east, or a WD received from another memory unit that is adjacent to memory unit 321 from the west). Further, memory unit 321 can have WD count 336 that can be incremented each time memory unit 321 is affected by a write disturb from a vertical direction (e.g., a WD received from another memory unit that is adjacent to memory unit 321 from the north, or a WD received from another memory unit that is adjacent to memory unit 321 from the south). Similarly, memory unit 322 can have WD count 337 for tracking write disturb occurrences arriving at memory unit 322 from another memory unit to the east of memory unit 322 and write disturb occurrences arriving at memory unit 322 from another memory unit to the west of memory unit 322 (e.g., disturbs coming from a horizontal direction). Memory unit 322 can also have WD count 338 for tracking write disturb occurrences arriving at memory unit 322 from another memory unit to the north of memory unit 322 and write disturb occurrences arriving at memory unit 322 from another memory unit to the south of memory unit 322 (e.g., disturbs coming from a vertical direction).

Given that memory device 305 tracks WD counts in two directions, horizontal and vertical, the processing logic can maintain location coefficient 341 associated with layer 310 for providing a weight for WD counts of a horizontal direction for memory units 311 and 312. The processing logic can further maintain location coefficient 342 associated with layer 310 for providing a weight for WD counts of a vertical direction for memory units 311 and 312. Accordingly, for calculating a weighted WD count for memory unit 311 of layer 310, the processing logic can use the following formula:

$$\text{Weighted WD count for unit311} = \text{location coefficient341} * \text{WD count331} + \text{location coefficient342} * \text{WD count332},$$

where "location coefficient 341*WD count 331" represents the weighted WD count in the horizontal direction for memory unit 311, and "location coefficient 342*WD count 332" represents the weighted WD count in the vertical direction for memory unit 311.

Similarly, for calculating a weighted WD count for memory unit 312 of layer 310, the processing logic can use the following formula:

$$\text{Weighted WD count for unit312} = \text{location coefficient 341} * \text{WD count333} + \text{location coefficient 342} * \text{WD count 334},$$

where "location coefficient 341*WD count 333" represents the weighted WD count in the horizontal direction for memory unit 312, and "location coefficient 342*WD count 334" represents the weighted WD count in the vertical direction for memory unit 312.

With respect to layer 320, the processing logic can maintain location coefficient 343 associated with layer 320 for providing a weight for WD counts of a horizontal direction for memory units 321 and 322. The processing logic can further maintain location coefficient 344 associated with layer 320 for providing a weight for WD counts of a vertical direction for memory units 321 and 322. Accordingly, for calculating a weighted WD count for memory unit 321 of layer 320, the processing logic can use the following formula:

$$\text{Weighted WD count for unit 321} = \text{location coefficient 343} * \text{WD count 335} + \text{location coefficient 344} * \text{WD count 336},$$

where "location coefficient 343*WD count 335" represents the weighted WD count in the horizontal direction for memory unit 321, and "location coefficient 344*WD count 336" represents the weighted WD count in the vertical direction for memory unit 321.

Similarly, for calculating a weighted WD count for memory unit 322 of layer 320, the processing logic can use the following formula:

$$\text{Weighted WD count for unit322} = \text{location coefficient 343} * \text{WD count335} + \text{location coefficient 344} * \text{WD count 336},$$

where "location coefficient 343*WD count 335" represents the weighted WD count in the horizontal direction for memory unit 322, and "location coefficient 344*WD count 336" represents the weighted WD count in the vertical direction for memory unit 322. While this implementation discusses maintaining separate WD counts in two directions, the processing logic may perform tracking in more than two directions, e.g., by defining multiple imaginary axes in each of the horizontal and vertical planes. In this case, corresponding location coefficients can be defined and used in the above referenced formulas to calculated a weighted WD count for a given unit based on each available direction.

Figure 4:
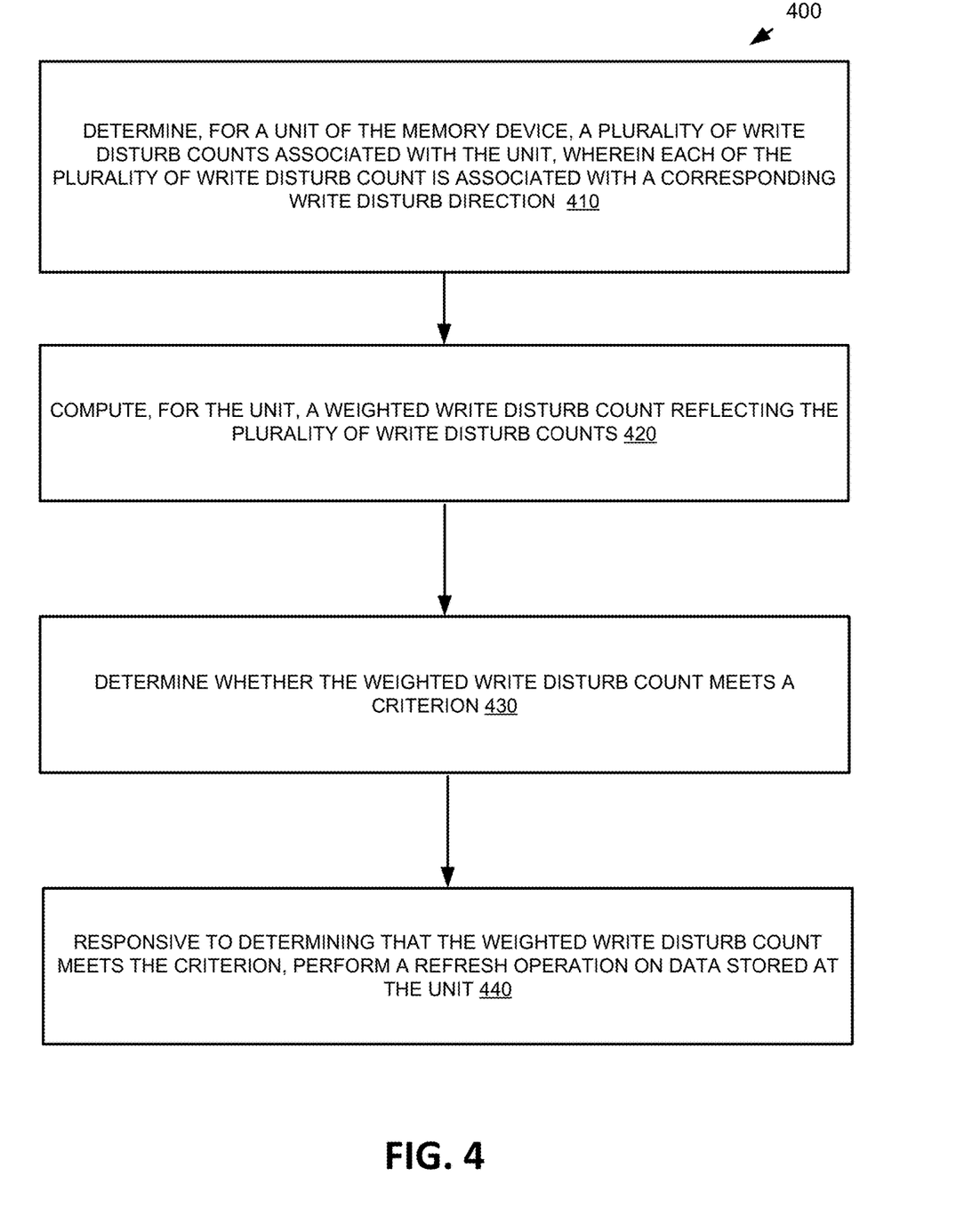
FIG. 4 is a flow diagram of an example method to manage write disturb for memory units of a memory device using weighted write disturb counts, in accordance with some other embodiments of the present disclosure.

FIG. 4 is a flow diagram of an example method 400 to manage write disturb for memory units of a memory device using weighted write disturb counts, in accordance with some other embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic determines, for a memory unit of the memory device (e.g., memory device 130 of FIG. 1), a set of write disturb (WD) counts of the memory unit, where each WD count corresponds to a write disturb direction from which the WD effect was received. In an implementation, the memory unit can receive WD effect from any direction of a number of directions, as a result of a write operation performed at an adjacent memory unit in that direction. Thus the processing logic can count the write disturb occurrences received from each directions separately, as explained in more details herein above.

At operation 420, the processing logic computes a weighted WD count that reflects the set of write disturb counts of the memory unit. In implementations, computing the weighted WD count of the memory unit can include identifying a layer of memory units where the memory unit is located and obtaining a coefficient corresponding to each WD direction, such that the coefficient is determined based on the layer of the memory unit, as explained in more details herein.

At operation 430, the processing logic determines whether the computed weighted WD count of the memory unit meets a criterion. As an example, the processing logic can determine whether the computed weighted WD count exceeds a certain threshold. The certain threshold controls the value of the weighted WD count that triggers performing a refresh operation on data of the memory unit. In one implementation, the certain threshold can be based on the layer of memory units where the memory unit is located. In other implementations, the processing logic can assign one threshold to the memory device, regardless of the layer where a memory unit is located.

At operation 440, when the processing logic determines that the weighted WD count of the memory unit meets the criterion, the processing logic performs a refresh operation on data stored at the memory unit. In some implementations, performing the refresh operation includes reading data stored at the memory unit and then writing the data back to the memory unit, to reset voltage offsets of the memory units as explained in more details herein.

Figure 5:
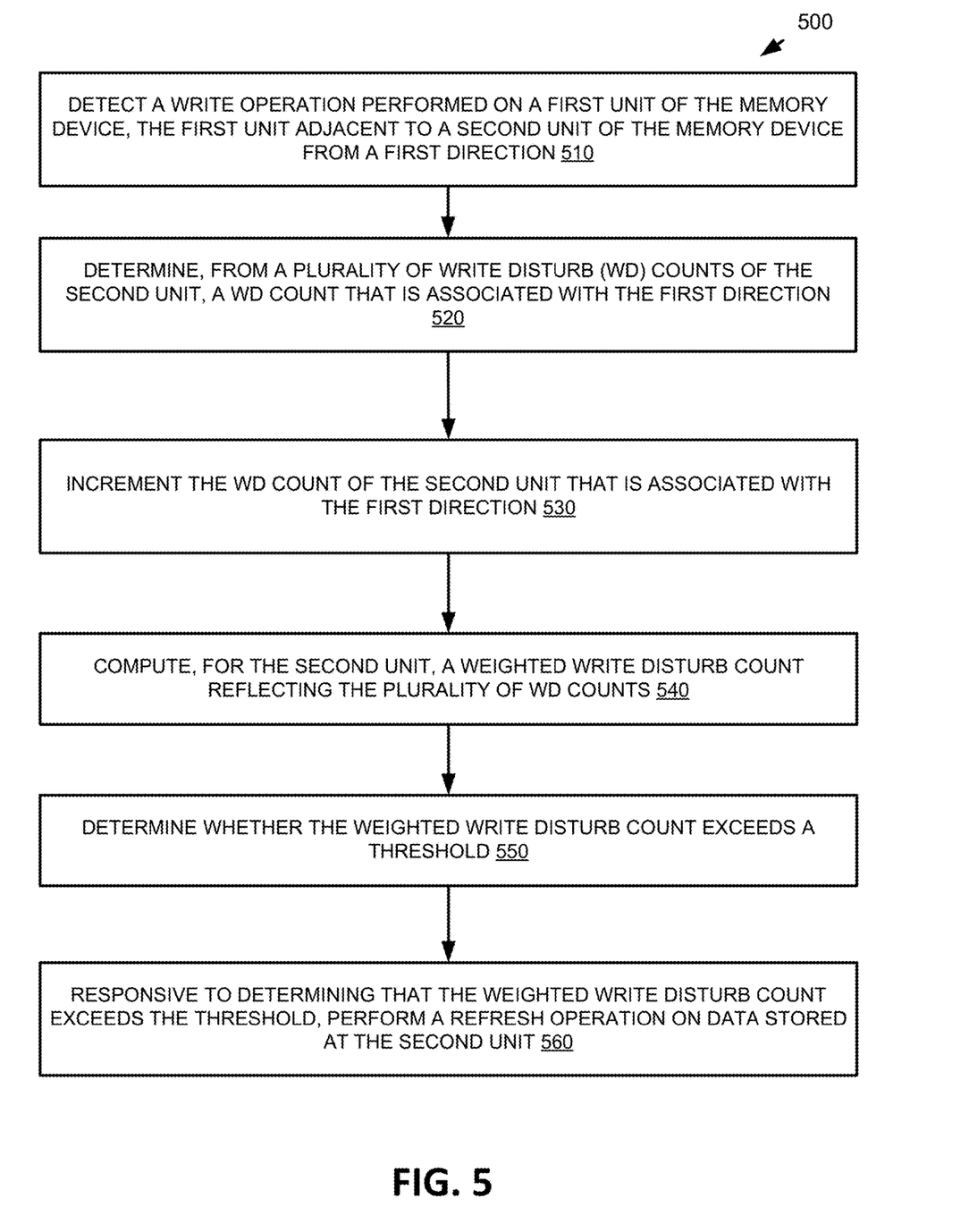
FIG. 5 is a flow diagram of an example method to increment a write disturb count for a memory unit of a memory device based on a write disturb from an adjacent memory unit in a certain direction, in accordance with some other embodiments of the present disclosure.

FIG. 5 is a flow diagram of an example method 500 to increment a write disturb count for a memory unit of a memory device based on a write disturb from an adjacent memory unit in a certain direction, in accordance with some other embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic detects a write operation performed on a memory unit of the memory device, where the first memory unit is adjacent to another memory unit of the memory device from a certain direction. In an implementation, the other memory unit can receive a write disturb (WD) effect from the certain direction as a result of the write operation performed at the adjacent memory unit in that direction, as explained in more details herein above.

At operation 520, the processing logic determines a WD count associated with the certain direction, from a set of WD counts belonging to the memory unit affected by the WD. In one implementation, the processing logic assigns a number of WD count to each memory unit, such that each WD count keeps track of WD occurrences in a corresponding direction.

At operation 530, the processing logic increments the determined WD count of the memory unit, reflecting the detected write operation at the adjacent memory unit. In some implementation, the processing logic stores the incremented WD count at a dedicated metadata table of the memory device, as explained in more details herein above.

At operation 540, the processing logic computes a weighted WD count that reflects the set of write disturb counts of the memory unit affected by the WD. In implementations, computing the weighted WD count of the memory unit can include identifying a layer of memory units where the memory unit is located and obtaining a coefficient corresponding to each WD direction, such that the coefficient is determined based on the layer of the memory unit, as explained in more details herein.

At operation 550, the processing logic determines whether the computed weighted WD count of the memory unit exceeds a certain threshold. The certain threshold controls the value of the weighted WD count that triggers performing a refresh operation on data of the memory unit. In one implementation, the certain threshold can be based on the layer of memory units where the memory unit is located. In other implementations, the processing logic can assign a single threshold to the memory device, regardless of the layer where a memory unit is located.

At operation 560, when the processing logic determines that the weighted WD count of the memory unit exceeds the certain threshold, the processing logic performs a refresh operation on data stored at the memory unit. In some implementations, performing the refresh operation includes reading data stored at the memory unit and then writing the data back to the memory unit, to reset voltage offsets of the memory units as explained in more details herein.

Figure 6:
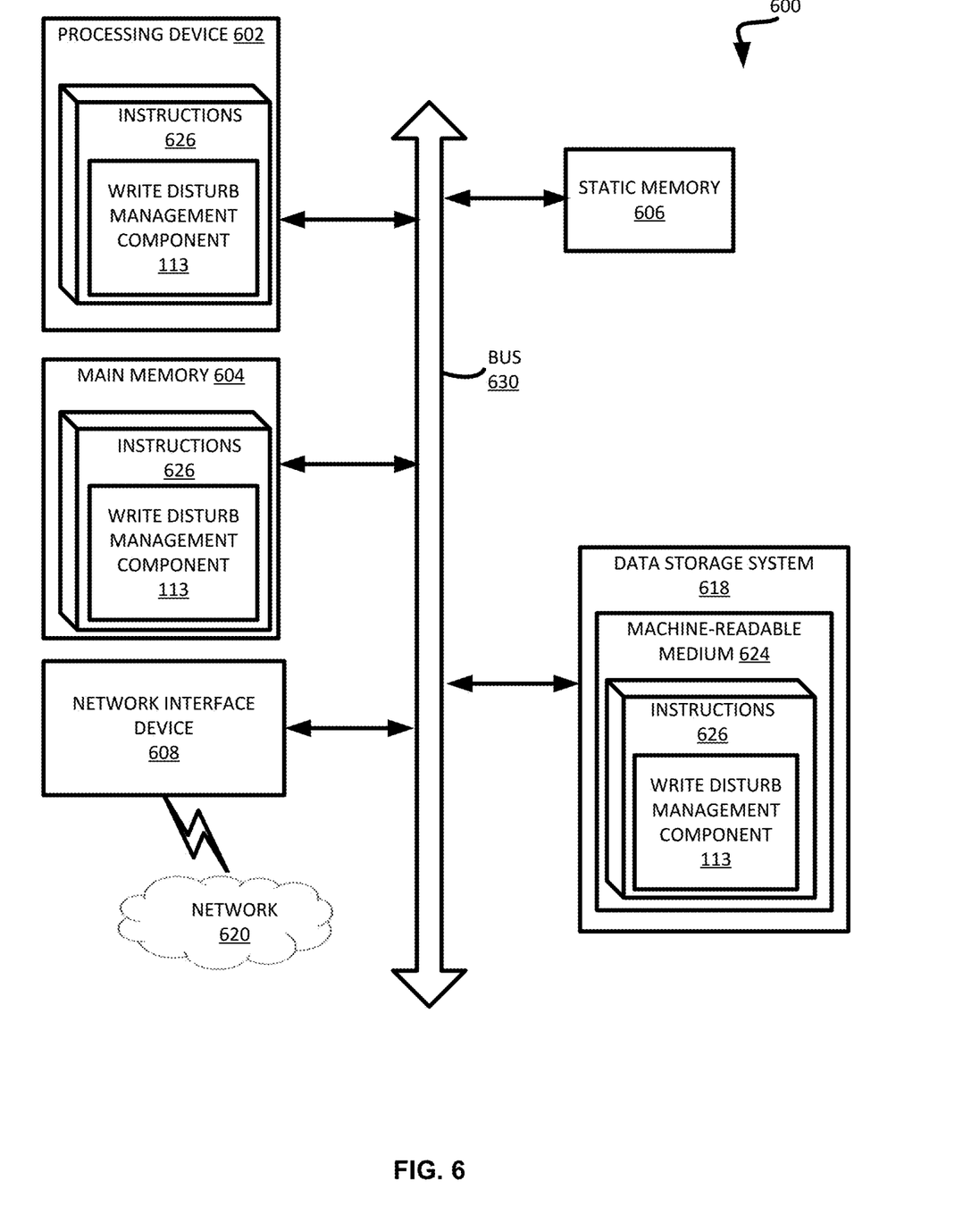
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to write disturb management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a refresh operation component (e.g., write disturb management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled to the memory device, to perform operations comprising:
   determining, for a first memory unit of the memory device, a plurality of write disturb (WD) counts associated with the first memory unit, wherein each of the plurality of WD counts is associated with a corresponding write disturb direction;
   computing, for the first memory unit, a weighted WD count reflecting the plurality of WD counts, wherein the weighted WD count is computed based on weighting coefficients reflecting a memory device layer in which the first memory unit is located;
   determining whether the weighted WD count meets a criterion; and
   responsive to determining that the weighted WD count meets the criterion, performing a refresh operation on the first memory unit.

2. The system of claim 1, wherein the criterion corresponds to the layer associated with the first memory unit.

3. The system of claim 1, wherein the plurality of layers comprises a plurality of decks of the memory device, and wherein the location of the first memory unit corresponds to a deck of the plurality of decks where the first memory unit is located.

4. The system of claim 1, wherein the first memory unit comprises one or more adjacent memory cells of the memory device.

5. The system of claim 1, wherein to compute the weighted WD count, the processing device is to perform further operations comprising:
   identifying, among a plurality of layers of the memory device, a layer associated with the first memory unit;
   for each WD count of the plurality of WD counts of the first memory unit, determining a coefficient associated with a respective WD count based on the layer; and
   computing the weighted WD count for the first memory unit in view of the plurality of WD counts and corresponding coefficients.

6. The system of claim 5, wherein a coefficient of a WD count of the plurality of WD counts of the first memory unit comprise a weight of the WD count within the computed weighted WD count of the first memory unit.

7. The system of claim 1, wherein to perform the refresh operation on data stored at the first memory unit, the processing device is to perform further operations comprising:
   reading data from the first memory unit; and
   writing the data back to the first memory unit.

8. The system of claim 1, wherein a WD count of the plurality of WD counts of the first memory unit corresponds to a number of occurrences of a write operation to a second memory unit that is adjacent to the memory unit in the corresponding WD direction.

9. The system of claim 1, wherein the processing device is to perform further operations comprising:
   detecting a write operation performed on a second memory unit of the memory device, the second memory unit adjacent to the first memory unit from a first direction;
   selecting a WD count of the plurality of WD counts of the memory unit based on the first direction; and
   incrementing the WD count associated with the first direction.

10. The system of claim 1, wherein the processing device is to perform further operations comprising:
    responsive to performing the refresh operation on data stored at the first memory unit, resetting each of the plurality of WD counts to zero.

11. A method comprising:
    detecting a write operation performed on a first memory unit of the memory device, the first memory unit adjacent to a second memory unit of the memory device in a certain direction;
    determining, from a plurality of WD counts of the second memory unit, a WD count that is associated with the certain direction;
    incrementing the WD count of the second memory unit that is associated with the certain direction;
    computing, for the second memory unit, a weighted WD count reflecting the plurality of WD counts, wherein the weighted WD count is computed based on weighting coefficients reflecting a memory device layer in which the first memory unit is located;
    determining whether the weighted WD count meets a criterion; and
    responsive to determining that the weighted WD count meets the criterion, performing a refresh operation on data stored at the second memory unit.

12. The method of claim 11, wherein the criterion corresponds to the layer associated with the second memory unit.

13. The method of claim 11, wherein the second memory unit comprises one or more adjacent memory cells of the memory device.

14. The method of claim 11, wherein computing the weighted WD count further comprises:
    identifying, among a plurality of layers of the memory device, a layer associated with the second memory unit;
    for each WD count of the plurality of WD counts of the second memory unit, determining a corresponding coefficient based on the layer; and
    computing the weighted WD count for the second memory unit in view of the plurality of WD counts and corresponding coefficients.

15. A non-transitory computer-readable storage medium comprising instructions that, when executed by a processing device, cause the processing device to perform operations comprising:
    determining, for a first memory unit of the memory device, a plurality of write disturb (WD) counts associated with the first memory unit, wherein each of the plurality of WD counts is associated with a corresponding write disturb direction;
    computing, for the first memory unit, a weighted WD count reflecting the plurality of WD counts, wherein the weighted WD count is computed based on weighting coefficients reflecting a memory device layer in which the first memory unit is located;

determining whether the weighted WD count meets a criterion; and responsive to determining that the weighted WD count meets the criterion, performing a refresh operation on the first memory unit.

16. The non-transitory computer-readable storage medium of claim 15, wherein to perform the refresh operation on data stored at the first memory unit, the processing device is to perform further operations comprising:

reading data from the first memory unit; and writing the data back to the first memory unit.

17. The non-transitory computer-readable storage medium of claim 15, wherein a WD count of the plurality of WD counts of the first memory unit corresponds to a number of occurrences of a write operation to a second memory unit that is adjacent to the first memory unit from a corresponding direction.

18. The non-transitory computer-readable storage medium of claim 15, wherein the processing device is to perform further operations comprising:

detecting a write operation performed on a second memory unit of the memory device, the second memory unit adjacent to the memory unit from a certain direction;

selecting a WD count of the plurality of WD counts of the first memory unit based on the certain direction; and incrementing the WD count associated with the certain direction.

\* \* \* \* \*